United States Patent
Mariano Juste et al.

(10) Patent No.: US 11,163,229 B2
(45) Date of Patent: Nov. 2, 2021

(54) INDUCED STRESS FOR EUV PELLICLE TENSIONING

(71) Applicants: IMEC VZW, Leuven (BE); Katholieke Universiteit Leuven, KU LEUVEN R&D, Leuven (BE)

(72) Inventors: Marina Mariano Juste, Leuven (BE); Marina Timmermans, Bertem (BE); Ivan Pollentier, Langdorp (BE); Cedric Huyghebaert, Heverlee (BE); Emily Gallagher, Burlington, VT (US)

(73) Assignees: IMEC VZW, Leuven (BE); KATHOLIEKE UNIVERSITEIT LEUVEN, KU LEUVEN R&D, Leuven (BE)

( * ) Notice: Subject to any disclaimer, the term of this patent is extended or adjusted under 35 U.S.C. 154(b) by 198 days.

(21) Appl. No.: 16/674,582

(22) Filed: Nov. 5, 2019

(65) Prior Publication Data

US 2020/0201169 A1 Jun. 25, 2020

(30) Foreign Application Priority Data

Dec. 20, 2018 (EP) .................... 18214565

(51) Int. Cl.
  *G03F 1/64* (2012.01)
  *G03F 1/62* (2012.01)
  *G03F 1/40* (2012.01)

(52) U.S. Cl.
  CPC .............. *G03F 1/64* (2013.01); *G03F 1/40* (2013.01); *G03F 1/62* (2013.01)

(58) Field of Classification Search
  CPC ............. G03F 1/40; G03F 1/62; G03F 1/64
  USPC .......................................... 430/5
  See application file for complete search history.

(56) References Cited

U.S. PATENT DOCUMENTS

| | | |
|---|---|---|
| 7,110,195 B2 | 9/2006 | Gallagher et al. |
| 2011/0012476 A1 | 1/2011 | Chen et al. |
| 2018/0117639 A1 | 5/2018 | Goldfarb |

FOREIGN PATENT DOCUMENTS

| | | |
|---|---|---|
| EP | 1914781 A2 | 4/2008 |
| EP | 1914781 A3 | 11/2009 |
| EP | 3404487 A1 | 11/2018 |
| TW | 201020208 A | 6/2010 |
| WO | 2015/082214 A1 | 6/2015 |
| WO | 2017/067813 A2 | 4/2017 |
| WO | 2017/102380 A1 | 6/2017 |

OTHER PUBLICATIONS

European Search Report, European Patent Application No. 18214565.6, dated Jul. 5, 2019, 7 pages.
Kibalchenko, Mikhail et al., "Magnetic Response of Single-Walled Carbon Nanotubes Induced by an External Magnetic Field", ACS NANO, vol. 5, No. 1, 2011, pp. 537-545.
Nassiri, Ali et al., "Response of Carbon Nanotube (CNT) Ply Subjected to a Pulsed Magnetic Field", arXiv preprint arXiv:1606.04893, 2016, 9 pages.
Yehezkel, Shani et al., "Bundled and Densified Carbon Nanotubes (CNT) Fabrics as Flexible Ultra-Light Weight Li-ion Battery Anode Current Collectors", Journal of Power Sources, vol. 312, 2016, pp. 109-115.
Amani, Ali Mohammad et al., "Electric Field Induced Alignment of Carbon Nanotubes: Methodology and Outcomes", In Carbon Nanotubes-Recent Progress, IntechOpen, 2017, pp. 71-88.

*Primary Examiner* — Christopher G Young
(74) *Attorney, Agent, or Firm* — McDonnell Boehnen Hulbert & Berghoff LLP

(57) ABSTRACT

A method for protecting a photomask comprises: (i) providing the photomask, (ii) providing a border, (iii) depositing at least two electrical contacts on the border, (iv) mounting a film comprising carbon nanotubes on the border such that the film comprises a free-standing part, wherein after the mounting and depositing steps, the electrical contacts are in contact with the film, (v) inducing a current through the free-standing part of the film by biasing at least one pair of the electrical contacts, and (vi) mounting the border on at least one side of the photomask with the free-standing part of the film above the photomask.

20 Claims, 5 Drawing Sheets

INDUCED STRESS FOR EUV PELLICLE TENSIONING

CROSS-REFERENCE TO RELATED APPLICATION

The present application is a non-provisional patent application claiming priority to European Patent Application No. 18214565.6 filed Dec. 20, 2018, the contents of which are hereby incorporated by reference.

TECHNICAL FIELD

The present disclosure relates to the field of photolithography. More specifically it relates to a method for protecting a photomask by providing a free-standing pellicle above the photomask.

BACKGROUND

In lithography, a pellicle prevents particles from falling onto the patterned surface mask. Particles may fall on the photomask during storage, handling, and during lithographic exposure. A pellicle mounted above the patterned photomask surface will suspend the particle in a plane that is out of focus so that most particles will not create a wafer pattern error when the photomask is imaged in a lithographic exposure tool. The pellicle can comprise a transparent film that does not change the path of the light or impact imaging.

Some lithography tools expose photomasks with extreme ultraviolet (EUV) light centered at 13.5 nm. As this wavelength is easily absorbed by all materials, it is difficult to develop a sufficiently thin film that is strong enough to be free-standing and transparent enough for the pellicle application.

Carbon nanotubes (CNTs) have proven to be a strong candidate—providing protection against particles while introducing only minimal changes to the exposure light. CNT films can routinely achieve above 96% transmittance at the 13.5 nm exposure wavelength light, maintain transparency at other metrology wavelengths (190-500 nm), and are intrinsically robust. A concern with any pellicle is balancing the film stress so that it is not so tensile that it breaks but is sufficiently tensile to avoid sagging. For CNT-based films, a relaxation of the CNT-CNT bonding has been observed both after membrane formation and over time, resulting in sagging of the film. This sagging compromises the mechanical integrity and optical consistency of the pellicle. The pellicle may contact a component of the scanner, handling system, or the mask carrier as a result of the sagging. Also, if an interaction exists between the light and the pellicle, that interaction could change as a result of the sagging since the light will pass through the pellicle at an angle.

There is therefore a need for pellicles and for methods to fabricate these pellicles in a lithography process wherein these pellicles comprise a film with a good transparency of the EUV light, and for which sagging is prevented.

SUMMARY

It is an object of embodiments of the present disclosure to provide a method to obtain a pellicle for protecting a photomask.

The above objective is accomplished by a method and device according to the present disclosure.

Embodiments of the present disclosure relate to a method for protecting a photomask. The method comprises: (i) providing the photomask, (ii) providing a border, (iii) depositing at least two electrical contacts on the border, (iv) mounting a film comprising carbon nanotubes on the border such that the film comprises a free-standing part, wherein after the mounting and depositing steps, the electrical contacts are in contact with the film, (v) inducing a current through the free-standing part of the film by biasing at least one pair of the electrical contacts, and (vi) mounting the border on at least one side of the photomask with the free-standing part of the film above the photomask.

According to the present disclosure, compliance to pellicle requirements can be achieved without additional materials, complex tools, or difficult procedures (the pellicle is the structure comprising the film and the border). In embodiments of the present disclosure, the free-standing CNTs forming the pellicle are changed by applying a current, producing a tensile CNT film sitting on top of a border forming the pellicle. This procedure can be repeated multiple times as needed, can be performed outside of the scanner, and can be applied to pellicles already mounted on reticles.

Tension is induced on the CNT based film through the application of current. This may be achieved using readily available equipment. The application of current can be done in a clean room without risk of adding particles.

A current generator may be connected with the pair of electrical contacts for inducing a current directly, or a voltage difference may be applied to induce a current through the free-standing part of the film.

A current could also be induced with a changing magnetic field. An alternative method according to embodiments of the present disclosure may therefore comprise the following steps: (i) providing the photomask, (ii) providing a border, (iii) mounting a film comprising carbon nanotubes on the border such that the film comprises a free-standing part, (iv) inducing a current through the free-standing part of the film by applying a changing magnetic field in the free-standing part of the film, and (v) mounting the border on at least one side of the photomask with the free-standing part of the film above the photomask.

The method provides an alternative process to help address the same problem and aims to protect a photomask by providing a free-standing part of the film above the photomask.

Tension is induced on the CNT based film by inducing a current through the free-standing part of the film.

According to the present disclosure, sagging and wrinkling of the film can be reduced or even completely eliminated by inducing a current through the free-standing part of the film.

In embodiments of the present disclosure, the current is induced by biasing at least two pairs of the electrical contacts.

According to the present disclosure, a better distribution of the current is obtained when applying the voltage over at least two contact pairs. The more uniform the electrical field applied over the free-standing part of the film is, the more uniform the tensile strength of the film will be.

In embodiments of the present disclosure, a single current pulse is induced through the free-standing part of the film. This may be achieved by applying a biasing pulse over at least one pair of the electrical contacts for biasing the at least one pair of the electrical contacts or by applying a magnetic field pulse in the free-standing part of the film.

In embodiments of the present disclosure, a current pulse train with a predefined duty cycle is induced through the free-standing part of the film. This may be achieved by applying a biasing pulse train over the at least one pair of contacts for biasing the at least one pair of the electrical contacts or by applying a magnetic field pulse train in the free-standing part of the film.

In embodiments of the present disclosure, the provided border is a silicon border.

In embodiments of the present disclosure, the border is provided by providing a silicon-based material and by partially removing the silicon-based material.

In embodiments of the present disclosure, the electrical contacts are obtained by depositing a titanium seed layer followed by deposition of palladium.

In embodiments of the present disclosure, the film is prepared by dry transfer of carbon nanotubes.

The carbon nanotubes may be grown by a floating catalyst chemical vapor deposition method or extracted from solution using vacuum filtration onto a filter paper. Methods for doing so can include floating aerosol CVD reactors depositing onto a filter paper, CVD forests drawn into membranes, vacuum filtration of a CNT solution, or spin coating onto an intermediate substrate. In embodiments of the present disclosure, mounting of the film comprises placing carbon nanotubes on top of a filter paper or drawing a sheet from a carbon nanotube forest, and the film is mounted by pressing the filter paper or the drawn sheet to the border.

According to embodiments of the present disclosure, drawing CNT sheets from vertically-oriented CNT forests grown by fixed catalyst CVD generates more aligned films.

In embodiments of the present disclosure, the method comprises applying isopropyl alcohol on the film after depositing the film.

According to embodiments of the present disclosure, an increased densification and/or an increased adhesion is obtained by applying isopropyl alcohol (vapor, spray or wet) on the film.

In embodiments of the present disclosure, the method comprises providing a coating on the film.

According to embodiments of the present disclosure, the CNT film lifetime in the environment of hydrogen radicals is prolonged. Even with a finite rate of etching in hydrogen radicals, it could be possible to have a pellicle with a finite lifetime since CNTs are not expensive to fabricate.

In embodiments of the present disclosure, one or more layers may be coated on the CNT film. In embodiments of the present disclosure, the coating may be provided on both sides of the membrane.

The coating may be provided before or after applying the voltage or current.

In embodiments of the present disclosure, a partial coating may be provided on the film.

According to embodiments of the present disclosure, by reducing the amount of coating material, the EUV transmission of the resulting CNT film is improved.

In embodiments of the present disclosure, the partial coating may be provided by deposition or decoration of defects in the film comprising the carbon nanotubes.

In embodiments of the present disclosure, a complete coating is provided on the film.

According to embodiments of the present disclosure, the CNT film lifetime may be prolonged even more (compared to partial coating) because of a controlled and complete coating.

In embodiments of the present disclosure, a conformal coating may be provided. In embodiments of the present disclosure, the complete coating may be provided with physical vapor deposition, or with atomic layer deposition, or with chemical vapor deposition, or with electrochemical deposition.

In embodiments of the present disclosure, the method comprises applying a lithography step on the photomask which is protected by the mounted film comprising carbon nanotubes.

Various aspects of the present disclosure are set out in the accompanying independent and dependent claims. Features from the dependent claims may be combined with features of the independent claims and with features of other dependent claims as appropriate and not merely as explicitly set out in the claims.

These and other aspects of the present disclosure will be apparent from, and elucidated with reference to, the embodiment(s) described hereinafter.

Figure 1:
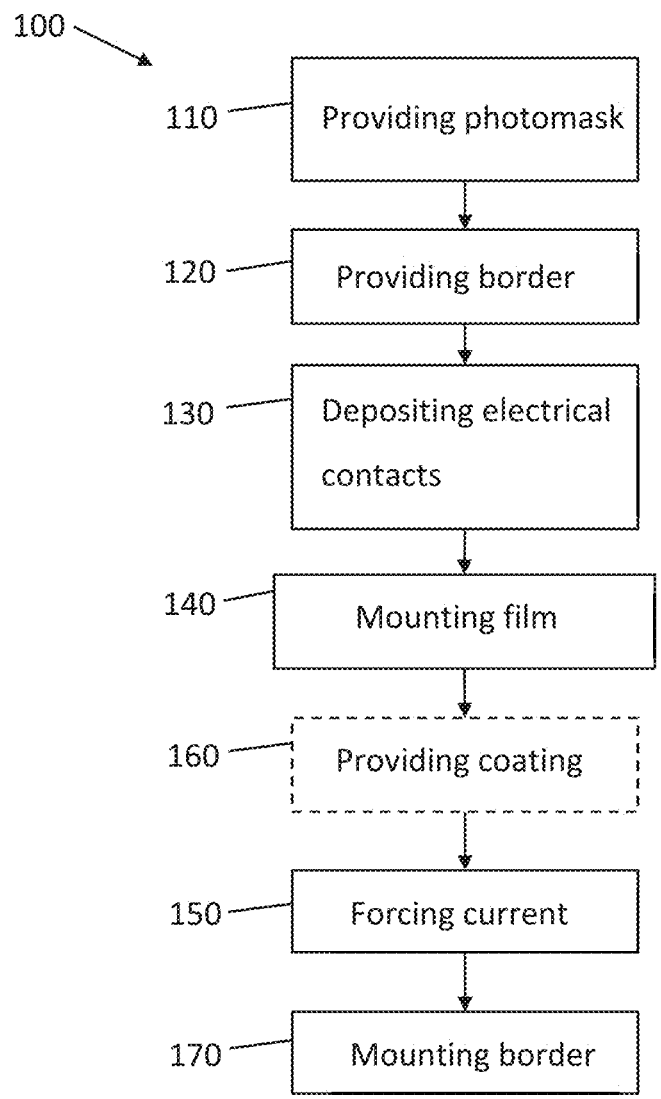
FIG. 1 shows a flow chart of an example method in accordance with embodiments of the present disclosure.

In the different drawings, the same reference signs refer to the same or analogous elements.

DETAILED DESCRIPTION

The present disclosure will be described with respect to particular embodiments and with reference to certain drawings, but the disclosure is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice of the disclosure.

The terms first, second, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

Moreover, the terms top, under, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps, components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent from this disclosure, in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various aspects of the disclosure. This method of disclosure, however, is not to be interpreted as reflecting an intention that the claims require more features than are expressly recited in each claim. Rather, as the claims reflect, patentable aspects may lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some, but not other, features included in other embodiments, combinations of features of different embodiments are meant to be within the scope of the present disclosure, and form different embodiments, as would be understood by those in the art. For example, in the claims, any of the claimed embodiments can be used in any combination.

In the description provided herein, numerous specific details are set forth. However, it is understood that embodiments of the present disclosure may be practiced without these specific details. In other instances, well-known methods, structures, and techniques have not been shown in detail in order not to obscure an understanding of this description.

Where, in embodiments of the present disclosure, reference is made to a film, reference is made to the cover which is protecting the photomask. This film may also be referred to as the "dust cover."

Where, in embodiments of the present disclosure, reference is made to a pellicle, reference is made to the mounted film plus the border, ready to be used in the scanner for exposure.

Embodiments of the present disclosure relate to a method 100 for protecting a photomask 210. The method comprises: (i) providing 110 the photomask 210, (ii) providing 120 a border 220, (iii) depositing 130 at least two electrical contacts 230 on the border 220, (iv) mounting 140 a film 240 comprising carbon nanotubes on the border 220 such that the film 240 comprises a free-standing part, wherein after the mounting 140 and depositing 130 step the electrical contacts 230 are in contact with the film 240, (v) biasing 150 at least one pair of the electrical contacts 230 such that a current is obtained through the free-standing part of the film, and (vi) mounting 170 the border 220 to at least one side of the photomask 210 with the free-standing part of the film above the photomask 210.

The border 220 and film 240 are attached to the photomask 210. This may be done directly or via use of an additional spacer frame. A border may be mounted on both sides of the photomask.

The steps are not necessarily in the order that is described above. The deposition 130 of the at least two electrical contacts 230 may, for example, be done before or after mounting 140 the film 240 comprising the carbon nanotubes. The photomask may, for example, also be provided 110 just before mounting 170 the border to the photomask 210.

A current may also be induced by applying a changing magnetic field in the free-standing part of the film. In that case, the electrical contacts are not strictly required. The changing magnetic field may induce Eddy currents in the film. The changing magnetic field in the film may, for example, be generated by an alternating current transformer or electromagnet which is positioned such that, during operation, a changing magnetic field is generated in the free-standing part of the film.

According to embodiments of the present disclosure, the tension in the free-standing part of the film is increased by biasing at least one contact pair such that a current is obtained through the free-standing part of the film. This may, for example, result in a stretched mesh of CNTs complying with scanner requirements: e.g., less than 0.7 mm of maximum deflection at 2 Pa pressure difference. In embodiments of the present disclosure, bulge test measurements may be done to quantify the tension of the film. The bulge tester can, for example, be used to quantify the maximum deflection of the film. The tension on the film may be tested using different types of equipment.

Figure 2:
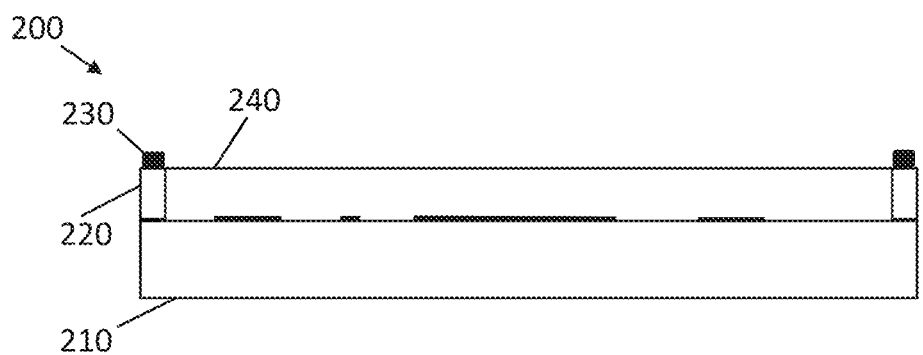
FIG. 2 shows a schematic drawing of a side view of a pellicle on a photomask obtained using a method in accordance with embodiments of the present disclosure.

A flow chart of an example method in accordance with embodiments of the present disclosure is illustrated in FIG. 1. FIG. 2 shows a schematic drawing of a photomask protected with a film comprising carbon nanotubes obtained using a method in accordance with embodiments of the present disclosure.

In the example method, a border is provided 120. This border 220 may, for example, be obtained from a Si wafer.

The border 220 may, for example, be fabricated by providing a substrate material (e.g., silicon wafer), depositing a masking material, for example SiN, on the substrate, and by partially removing the substrate material. For example, between 30 and 50 nm of the masking material (e.g., SiN) may be deposited on the substrate. The partial removal may be achieved by laser cutting or by patterning/etch processes (e.g., etch KOH 20%, 70 degrees Celsius, 8 hr., and clean with DI water/IPA). Other borders 220 may be used. Borders may, for example, comprise high-temperature ceramics.

In embodiments of the present disclosure, at least two electrical contacts 230 (also referred to as pads) are deposited on the border 220. This may be done before or after mounting 140 a film 240 comprising carbon nanotubes. The pads 230 may have different dimensions, and may be composed of different conducting materials, and placed differently depending on the desired effect. In embodiments of the present disclosure, the electrical contacts 230 may be obtained by creating a metal contact, for example, by depositing 130 a titanium adhesion layer followed by deposition of palladium. For example, a 0.3-2 nm titanium layer may be deposited on which a 50 nm palladium contact is grown (Ti/Pd). In embodiments of the present disclosure, the material(s) of the electrical contacts may be selected for a number of reasons, such that favorably low resistances are obtained. For example, palladium (Pd), gold (Au), and platinum (Pt) all have low resistance.

The film comprising carbon nanotubes (CNTs) can be assembled into free-standing films 240 whose morphology is dependent on the fabrication process.

The CNTs in the films 240 can be randomly oriented when prepared by either the dry transfer of the CNTs grown by the floating catalyst chemical vapor deposition (CVD) method, or vacuum filtration of the CNTs dispersed in a solution followed by the removal of the filter membrane.

Drawing CNT sheets from vertically-oriented CNT forests grown by fixed catalyst CVD generates more aligned CNTs in the films that can be arranged in one or multiple layers.

In some embodiments, the CNT films are mounted 140 by placing them on top of the support border 220 to create a free-standing film 240. For example, filter paper (aerosol collection method) or drawn sheet (vertical forest growth) may be pressed to the border for adhesion.

Optionally, IPA (vapor, spray, or wet) may be applied for densification and/or adhesion. The border could have a thin layer (5-50 nm) of SiN, TiN, or other material deposited for many reasons, for example, to improve chemical stability, balance stress, or improve adhesion of the CNTs or pads.

The free-standing film can be further processed—cleaned, coated, or stretched.

The CNTs form a film because of van der Waals forces between the CNTs that dominate on the nanoscale. Over time, sagging may be observed creating two concerns—variable optical influence that compromises printing quality and the risk of deflection during pressure fluctuations in the scanner.

Therefore, in embodiments of the present disclosure, a current is forced through the film 240 which is mounted at the borders 220. Applying this current may result in a change of the visual appearance on a macroscopic scale and strongly reduces, or even eliminates, sagging and wrinkling.

In embodiments of the present disclosure, at least two, or four or more, electrical contacts 230 (also referred to as pads) are placed on the border 220 so that current can be directed through the film either by applying current directly or by applying a voltage difference to induce current across the film. In embodiments of the present disclosure, the pads 230 may be distributed at different positions along the border. The pads 230 may be elongated contacts (e.g., with a length/width ratio limited only by the dimensions of the border and the need to isolate one pad from the other. The pads 230 are configured to induce a desired tension across the film when applying a current through the film by biasing at least two of the pads 230.

The border 220 is mounted 170 on the photomask 210 such that the free-standing part of the film 240 is above the photomask. In the example of FIG. 2, a schematic drawing of a resulting stack is shown. It shows the photomask 210 on which a pattern is schematically drawn. On top of the photomask the pellicle is present, with its borders 220 attached to the photomask 210, and the film 240 above the photomask 210. Although not drawn in this schematic drawing, a pellicle may be present on both sides of the photomask. In this schematic drawing, the electrical contacts 230 are also shown. These electrical contacts 230 are drawn on top of the border.

Figure 3:
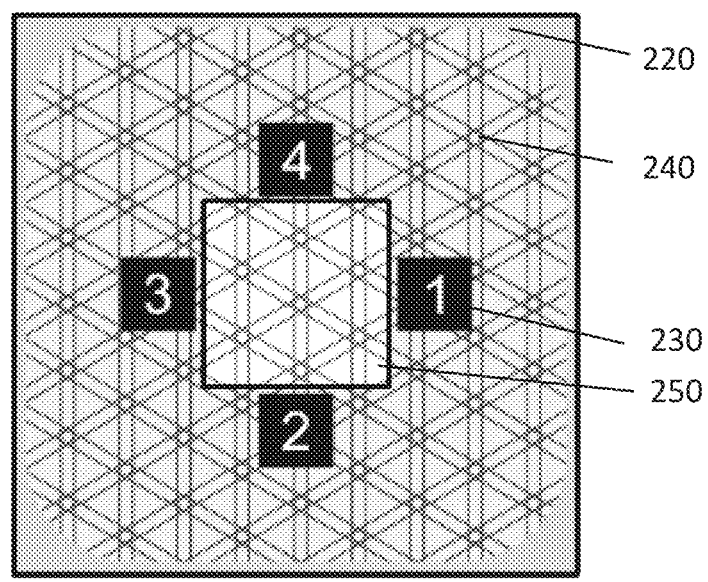
FIG. 3 shows a schematic drawing of a top view of a CNT film mounted on a border, wherein the CNT film has a square free-standing part delineated by the border, and wherein electrical contacts are present on the border in accordance with embodiments of the present disclosure.
Figure 4:
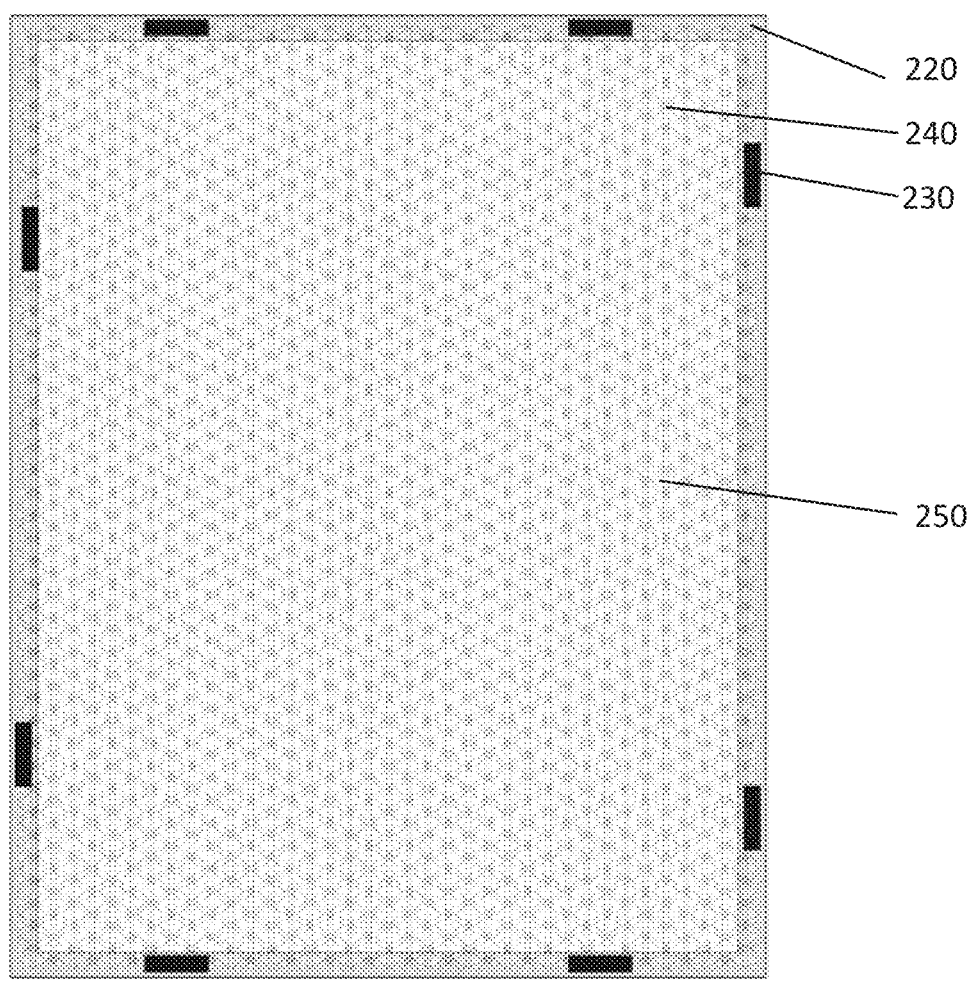
FIG. 4 shows a schematic drawing of a top view of a CNT film with a rectangular free-standing part mounted on a border with contacts on the border in accordance with embodiments of the present disclosure.

Examples of pads 230 on different sized borders are illustrated in the configurations in FIG. 3 and FIG. 4, respectively. FIG. 3 shows a 3×3 cm$^2$ outer dimension border 220 for test samples with four pads 230 deposited on the edges of the border 220. The border 220 is located between the outer square and the inner square. The CNT film 240 (shown by the pattern) is free-standing at the center 250 and supported on the border 220. FIG. 4 shows a schematic drawing of a larger sample, more compatible with a full-sized pellicle 120×150 cm$^2$ outer dimension with 8 pads 230 deposited, two per edge of the silicon-based border 220. The border 220 is located between the outer rectangle and the inner rectangle. The CNT film 240 is free-standing in the center 250 and sitting on the borders 220 at the edges.

In embodiments of the present disclosure, the border 220 encloses an open volume. By providing a film 240 on this border 220, the film 240 above this open volume is the free-standing part of the film 240. The shape of the free-standing area 250 of the film 240 is determined by the border 220 which encloses this area. In the examples in FIG. 3 and FIG. 4, a square or rectangular free-standing part 250 of the film 240 is shown. The present disclosure is, however, not limited thereto. Other configurations, such as circular ones, are also possible. These are determined by the border 220.

In embodiments of the present disclosure, biasing is done over one or more pairs of the electrical contacts 230. If, in the example of FIG. 3, a current is applied from contact 2 to contact 4, the current application treatment will modify the film 240 to become more tensile in the 2-4 direction. If the current is applied from 2 to 1, only a limited zone of treatment between contacts 2 and 1 will become more tensile as a result of the applied current. Either a single current may be induced along a single path or a plurality of currents may be induced between a plurality of contact pads. For example, a first voltage may be applied over the contacts 1 and 3 while, concurrently, a second voltage may be applied over the contacts 2 and 4. By doing so, a first current is obtained between the nodes 1 and 3 and a second current is obtained between the nodes 2 and 4. The first voltage may be different from the second voltage and additionally the first current may be different from the second current.

Figure 5:
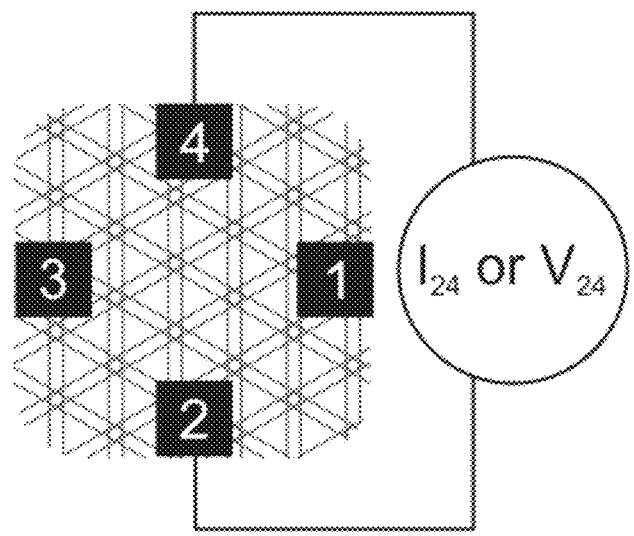
FIG. 5 shows a biasing scheme, wherein one pair of electric contacts is biased in accordance with embodiments of the present disclosure.

In embodiments of the present disclosure, the electrical resistance of the film 240 may be measured using the van der Pauw method to monitor film changes. The resistance can be measured before, during, and after tensioning to quantify the process. A sample procedure could involve measuring resistance and then applying current or voltage between two contacts ($I_{24}/V_{24}$ in FIG. 5). While doing so, the resistance can be measured, and the film may be visually inspected for smooth, wrinkle-free appearance. The tension may also be measured (e.g., indirectly via bulge test measurements that apply a pressure to the membrane while measuring the degree of deflection). If additional tensioning is desired, an additional pair of contacts may be used to apply current or voltage. For example, $I_{13}/V_{13}$. This procedure may be repeated over the different contact pairs ($I_{12}/V_{12}$, $I_{34}/V_{34}$, $I_{41}/V_{41}$, $I_{23}/V_{23}$, $I_{24}/V_{24}$ or $I_{13}/V_{13}$) while monitoring the resistance and checking for a smooth, wrinkle-free tension on the film. The biasing of the different pairs of electrical contacts 230 may be repeated until an even stress is achieved, the film is smooth and wrinkle-free, and the resistance has stabilized to a constant value. The goal is to use current to strategically induce an even tensile stress across the film.

Figure 6:
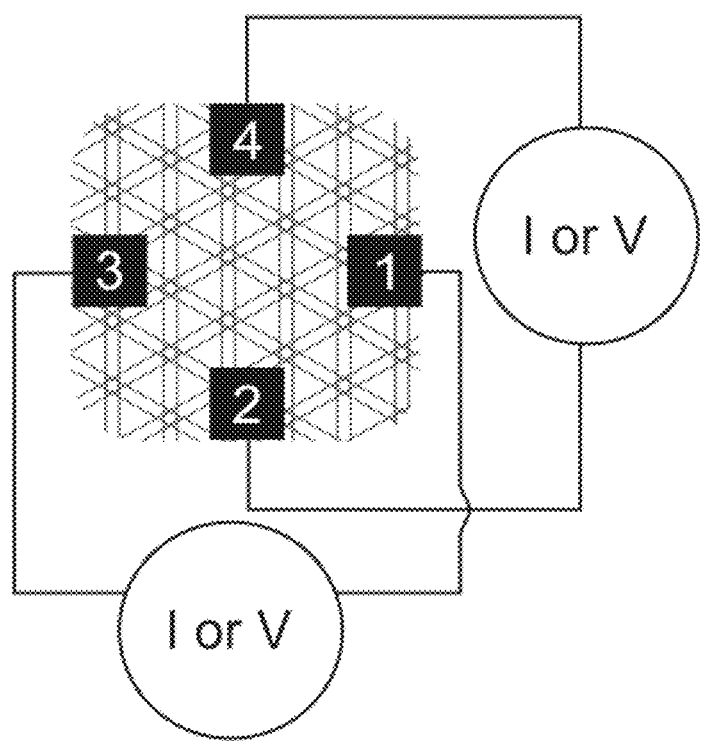
FIG. 6 shows a biasing scheme, wherein two pairs of electric contacts are biased in accordance with embodiments of the present disclosure.

As explained above, in embodiments of the present disclosure, the resistance of the film may be monitored for changes using the van der Pauw method. This is the reference resistance. A current or voltage may be applied on multiple electrical contacts simultaneously. An example of such a configuration is schematically illustrated in FIG. 6 showing voltage or current sources over contact pairs 1 and 3 ($I_{13}$ or $V_{13}$) and over contact pairs 2 and 4 ($I_{24}$ or $V_{24}$). For example, $I_{24}$ or $V_{24}$ and $I_{13}$ or $V_{13}$ are applied at the same time to create a dual channel configuration. In embodiments of the present disclosure, this multiple channel approach, wherein a plurality of pairs of electrical contacts is biased, may be expanded to a complex set of contacts and currents/voltages for the configuration as illustrated in FIG. 6, or for any configuration with even more contact pads.

In embodiments of the present disclosure, the method is appropriate for pellicles composed of uncoated CNT films and for pellicles formed from CNT films that are coated with different materials. In embodiments of the present disclosure, the CNT film coating 160 may be performed after depositing 130 the contact pads on the border and mounting 140 the uncoated CNT film.

In embodiments of the present disclosure, the amount of time while biasing a pair of electrical contacts such that a current is obtained through the free-standing part of the film may, for example, range from a few milliseconds to several seconds. The applied current may, for example, range from a few milliamperes (mA) to 200 mA or higher, and the applied voltage may, for example, vary from zero to 40 V. In some examples, the applied voltage may be above 20 V or even above 40 V, but those are not necessarily limitations of the procedure.

In embodiments of the present disclosure, a biasing pulse train (current or voltage) may be used for inducing such stress. The on/off ratio of such a pulse train may, for example, be tunable. The on/off ratio may, for example, be above 20%, 40%, 60%, or 80%. This is, however, not strictly required.

In embodiments of the present disclosure, the current may be applied such that heating of the free-standing part of the film is limited. During biasing the temperature of the film may, for example, remain below 200° C. or even below 30° C. This may, for example, be achieved by controlling the convective gas flow and duty ratio of the applied current or voltage. Therefore, the current may be limited to a maximum value, and/or the duration of the pulse may be limited to a maximum value, and/or in case of a pulse train the on/off ratio may be limited to a maximum value.

Figure 7:
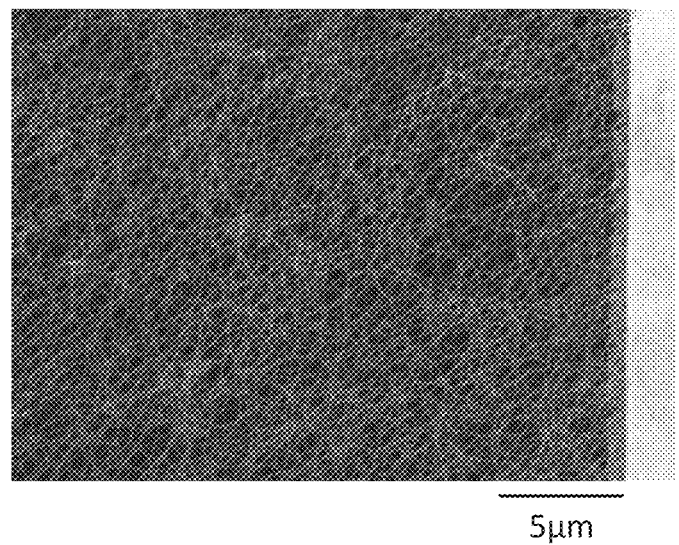
FIG. 7 shows a scanning electron microscope (SEM) image of a film before applying a current through a free-standing part of the film.
Figure 8:
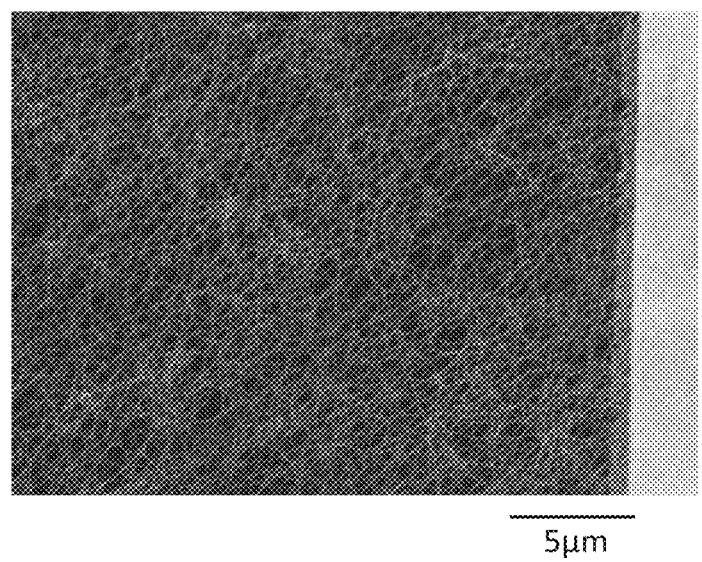
FIG. 8 shows a scanning electron microscope (SEM) image of a film after applying a current through a free-standing part of the film in accordance with embodiments of the present disclosure.

The resistance of the CNT film increases with the applied current. Without being bound by theory, it is assumed that this relationship between the resistance and the current suggests a nanoscale change in the film itself. FIG. 7 shows a scanning electron microscope (SEM) image of a film before applying a current through a free-standing part of the film. FIG. 8 shows a SEM image after applying the current such that an increased tension in the film is obtained. As can be seen from these figures, the SEMs show no difference. Therefore, it is assumed that the change may have more to do with nano-morphology (healing bonds) or volatilizing contaminants.

In embodiments of the present disclosure, a coating may be provided 160 on the film. This is an optional step which may, for example, be done before biasing 150 at least one pair of electrical contacts, thereby forcing a current through the free-standing part of the film. The present disclosure is, however, not limited thereto, and coating may also be done after biasing the contact pairs.

CNT films 240 can be coated either partially or completely. Partial coatings may be obtained by very thin (e.g., with a thickness below 3 nm) deposition or decoration of CNT defects. Complete coatings can, for example, be deposited with physical vapor deposition (PVD), i.e., e-beam or thermal evaporation, remote plasma sputtering, atomic layer deposition (ALD), chemical vapor deposition (CVD), electrochemical deposition (ECD), sol-gel techniques, or a combination of multiple methods. The coating may, for example, comprise the following materials: Zr, Y, B, Ti, Ru, Mo, and related components, nitrides, or oxides. The list is, however, not limited to these materials.

The process flow illustrated in FIG. 1 is an example process flow according to an embodiment of the present disclosure. The present disclosure is, however, not limited thereto. Steps can be skipped in some embodiments (for example the coating). It is also possible to change the order of the steps (for example, coating the film after applying the current).

The coating may comprise multi-layer coating of the free-standing carbon nanotube (CNT) film (such as double layer or multiple layers). This coating protects the film from an aggressive environment including, for example, hydrogen radicals if used as an EUV pellicle. The coating can also enhance the emissivity for more radiative cooling.

If used as an EUV pellicle, free-standing CNT films can be introduced into an environment with hydrogen radicals (H*) inside a scanner. CNT structures within the film (also referred to as a membrane), can be attacked by H* resulting in damage of the pellicle due to the CNT removal via gasification of carbon to hydrocarbon molecules. To avoid the pellicle degradation, CNT membranes can be protected to reduce or eliminate the H* damage. This can be accomplished by coating of the CNT membranes (e.g., from both sides) with thin films comprised of one or more layers. The protection may also be accomplished with targeted deposition on weak locations along the CNT tubes within the membrane.

Atomic layer deposition (ALD) may be used for conformal thin film deposition onto complex structures. However, conformal and pinhole free coating on CNTs is challenging due to the chemical inertness of the CNT surface with a small number of active sites for ALD nucleation in the beginning of the film growth.

In embodiments of the present disclosure, the first coating may be a partial coating layer. This may be achieved by selective coating of defects by atomic layer deposition (ALD) or chemical vapor deposition (CVD). H*-etching can start at defect sites of CNTs and then propagate along the tube length. ALD/CVD can start nucleating on defect sites allowing to selectively protect CNT defects from H*. According to the present disclosure, partial coating of the CNT defects can prolong the lifetime of the coated CNT pellicle as compared to the uncoated one.

Optionally, a second coating layer may be added on one or both sides of the CNT film on top of the partial ALD/CVD coating layer to improve emissivity. The coating can be applied by various thin film deposition techniques already listed above, e.g., thermal or e-beam evaporation, sputtering, etc.

In embodiments of the present disclosure, a complete coating may be provided on the CNT film 240 for protection. This layer may be achieved by a conformal coating step.

The conformal coating may be achieved by application of a seed (adhesion) layer, deposited by thermal or e-beam evaporation, prior to the ALD coating. This seed layer deposition approach is benign to the CNT structures, allowing for preservation of the pristine CNT properties. For the uniformity of the seed layer, evaporation may be performed under an angle, for example 15 degrees, but this could be 1 degree—89 degrees, and rotating the substrate during the deposition. ALD on top of seeded CNT structures will be uniform and conformal.

According to embodiments of the present disclosure, the above-mentioned seed layer serves as a protection of the CNT membrane during the deposition of subsequent layers that involve CNT exposure to harsh reaction conditions (e.g., plasma-based sputtering) or strong oxidizing agents (e.g., certain ALD processes), which are known to damage CNTs during the process.

In embodiments of the present disclosure, an intermediate deformable thin film coating could be added in between rigid coating films to reduce the stress of a multilayer coating, for example, carbon.

In embodiments, two layers may be applied using conformal coating. By applying two layers the stress may be balanced because the net stress is a combination of the compressive or tensile stresses induced by each layer. This may result in an even more tensile film and a film with a reduced number of wrinkles, or even a wrinkle free film.

In embodiments of the present disclosure, a CNT structure may be provided that is favorable for conformal coating. The CNT pellicle membrane may, for example, comprise N-doped CNTs. Doping CNT films with foreign atoms can make CNT films more favorable for ALD or CVD nucleation due to the introduction of reactive surface species.

The CNT films may comprise multiwalled CNTs for making them more favorable for conformal coating. In that case, one of the walls may be used as a sacrificial CNT wall to functionalize it to permit ALD seeding.

In embodiments of the present disclosure, the number of ALD cycles required to obtain a continuous and conformal ALD coating may be reduced by providing the coating on top of seeded CNTs. For example, ultra-thin layers may be provided by ALD (e.g., a Ruthenium coating).

In embodiments, a dry approach may be applied for conformal coating. In that case no solution is used for depositing the coating.

According to embodiments of the present disclosure, the intrinsic structural, mechanical, and electrical CNT properties are preserved by avoiding the damage of the CNT during the seeding layer growth.

According to embodiments of the present disclosure, various coating approaches are allowed once CNTs are protected by the seed layer from, e.g., ion bombardment during the coating process.

According to embodiments of the present disclosure, a conformal coating is applicable to highly-transparent, free-standing films of single-walled CNTs, which can have fewer defects as compared to multi-walled CNTs.

According to embodiments of the present disclosure, the CNT structure is favorable for conformal coating as it allows defect engineering of the CNT surface for controlled coating by ALD, while preserving the free-standing CNT membrane.

Methods in accordance with embodiments of the present disclosure may comprise a lithography step on the photomask, which is protected by the mounted film comprising carbon nanotubes.

In embodiments of the present disclosure, a CNT pellicle is made by mounting a CNT film between elevated borders and by applying a current to the free-standing part of the film. According to embodiments of the present disclosure, CNT pellicles improve lithography reticle protection.

In embodiments of the present disclosure, the lithography may be extreme ultraviolet lithography with a 13.5 nm wavelength. The present disclosure is, however, not limited to this wavelength. The wavelength may, for example, range between 3 and 248 nm. Using carbon nanotubes, a film can be made that is so thin that it does not influence the EUV light passing through the film. Moreover, the tensile stress can be increased by a method in accordance with embodiments of the present disclosure and that this tensile stress remains even over a longer period. The tensile stress may, for example, remain stable permanently.

What is claimed is:

1. A method for protecting a photomask, the method comprising:
   providing the photomask;
   providing a border;
   depositing at least two electrical contacts on the border;
   mounting a film comprising carbon nanotubes on the border such that the film comprises a free-standing part, wherein after the mounting and depositing steps, the electrical contacts are in contact with the film;
   inducing a current through the free-standing part of the film by biasing at least one pair of the electrical contacts; and
   mounting the border on at least one side of the photomask with the free-standing part of the film above the photomask.

2. The method according to claim 1, wherein inducing the current through the free-standing part of the film comprises inducing the current through at least two pairs of the electrical contacts.

3. The method according to claim 1, wherein inducing the current through the free-standing part of the film comprises inducing a single current pulse through the free-standing part of the film.

4. The method according to claim 1, wherein inducing the current through the free-standing part of the film comprises inducing a current pulse train with a predefined duty cycle through the free-standing part of the film.

5. The method according to claim 1, wherein providing the border comprises providing a silicon border.

6. The method according to claim 5, wherein providing the border comprises providing a silicon-based material and partially removing the silicon-based material.

7. The method according to claim 1, wherein depositing the at least two electrical contacts comprises depositing a titanium seed layer followed by depositing palladium.

8. The method according to claim 1, further comprising preparing the film by (i) dry transfer of carbon nanotubes or (ii) by extraction from a solution using vacuum filtration onto a filter paper.

9. The method according to claim 1, further comprising applying isopropyl alcohol on the film after mounting the film.

10. The method according to claim 1, further comprising providing a coating on the film.

11. The method according to claim 10, wherein providing the coating comprises providing a partial coating on the film.

12. The method according to claim 10, wherein providing the coating comprises providing a complete coating on the film.

13. The method according to claim 1, further comprising applying a lithography step on the photomask, wherein the photomask is protected by the mounted film comprising carbon nanotubes.

14. A method for protecting a photomask, the method comprising:
providing the photomask;
providing a border;
mounting a film comprising carbon nanotubes on the border such that the film comprises a free-standing part;
inducing a current through the free-standing part of the film by applying a changing magnetic field in the free-standing part of the film; and
mounting the border on at least one side of the photomask with the free-standing part of the film above the photomask.

15. The method according to claim 14, wherein inducing the current through the free-standing part of the film comprises inducing a single current pulse through the free-standing part of the film.

16. The method according to claim 14, wherein inducing the current through the free-standing part of the film comprises inducing a current pulse train with a predefined duty cycle through the free-standing part of the film.

17. The method according to claim 14, wherein providing the border comprises providing a silicon border.

18. The method according to claim 17, wherein providing the border comprises providing a silicon-based material and partially removing the silicon-based material.

19. The method according to claim 14, further comprising preparing the film by (i) dry transfer of carbon nanotubes or (ii) by extraction from a solution using vacuum filtration onto a filter paper.

20. The method according to claim 14, further comprising applying isopropyl alcohol on the film after mounting the film.

* * * * *